US 10,872,935 B2

(12) United States Patent
Kim et al.

(10) Patent No.: US 10,872,935 B2
(45) Date of Patent: Dec. 22, 2020

(54) DISPLAY DEVICE

(71) Applicant: LG Display Co., Ltd., Seoul (KR)

(72) Inventors: Byong-Hoo Kim, Paju-si (KR); Min-Joo Kim, Seoul (KR); Eun-Pyo Hong, Paju-si (KR); Jae-Won Lee, Goyang-si (KR); Sang-Hoon Pak, Seoul (KR); Sang-Hyuk Won, Gimpo-si (KR); Jae-Man Jang, Seoul (KR); Sung-Jin Kim, Seoul (KR); Jae-Hyung Jang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/679,938

(22) Filed: Nov. 11, 2019

(65) Prior Publication Data
US 2020/0152708 A1 May 14, 2020

(30) Foreign Application Priority Data
Nov. 14, 2018 (KR) .......... 10-2018-0139766

(51) Int. Cl.
| G06F 3/041 | (2006.01) |
| G06F 3/044 | (2006.01) |
| H01L 27/32 | (2006.01) |
| H01L 51/56 | (2006.01) |
| H01L 51/52 | (2006.01) |

(52) U.S. Cl.
CPC .......... *H01L 27/323* (2013.01); *G06F 3/0412* (2013.01); *G06F 3/0446* (2019.05); *H01L 51/5253* (2013.01); *H01L 51/56* (2013.01); *G06F 2203/04102* (2013.01); *G06F 2203/04103* (2013.01); *G06F 2203/04111* (2013.01); *H01L 27/3244* (2013.01)

(58) Field of Classification Search
CPC .... G06F 3/041; G06F 3/0412; G06F 3/04164; G06F 3/044; G06F 3/0443; G06F 3/0446; G06F 2203/04102; G06F 2203/04103; G06F 2203/04111; G09G 3/3208; H01L 27/323; H01L 27/3244; H01L 51/5237; H01L 51/524; H01L 51/5253; H01L 51/56
See application file for complete search history.

(56) References Cited

U.S. PATENT DOCUMENTS

| 2005/0087769 A1* | 4/2005 | Yamazaki | H01L 27/1259 257/202 |
| 2016/0095172 A1* | 3/2016 | Lee | H01L 51/5253 313/504 |
| 2017/0084774 A1* | 3/2017 | Im | H01L 31/153 |
| 2019/0006450 A1* | 1/2019 | Lee | H01L 27/3262 |
| 2019/0115411 A1* | 4/2019 | Park | H01L 27/3272 |
| 2019/0211219 A1* | 7/2019 | Kondo | C09D 11/101 |

* cited by examiner

*Primary Examiner* — Michael J Eurice
(74) *Attorney, Agent, or Firm* — Seed IP Law Group LLP

(57) ABSTRACT

Disclosed is a display device capable of being manufactured through a simplified process and having improved touch sensitivity. The display device includes an encapsulation unit disposed on a light-emitting element, a touch sensor disposed on the encapsulation unit, and an intermediate layer disposed between the encapsulation unit and the touch sensor. The intermediate layer includes a first intermediate layer, having a dielectric constant that is lower than a dielectric constant of an organic film disposed above or under the intermediate layer, and a second intermediate layer, having greater hardness than the first intermediate layer, whereby touch sensitivity is improved while processing is simplified.

26 Claims, 9 Drawing Sheets

LINEAR

LADDER

CYCLIC

HIGH HARDNESS —184

| HIGH HARDNESS —184b |
| LOW HARDNESS —184a |

} 184

DISPLAY DEVICE

CROSS-REFERENCE TO RELATED APPLICATION(S)

This application claims the benefit of Korean Patent Application No. 10-2018-0139766, filed on Nov. 14, 2018, which is hereby incorporated by reference as if fully set forth herein.

BACKGROUND

Technical Field

The present disclosure generally relates to a display device, and more particularly to a display device capable of being manufactured through a simplified process and having improved touch sensitivity.

Description of the Related Art

A touchscreen is an input device that allows a user to input a command by selecting one of multiple instructions displayed on a screen, such as that of a display device, using a user's hand or an object. That is, the touchscreen converts the contact position, at which the user's hand or the object directly contacts the touchscreen, into an electrical signal to receive the instruction selected at the contact position as an input signal. Use of the touchscreen has increased, since the touchscreen is capable of replacing a separate input device that is connected to the display device for operation, such as a keyboard or a mouse.

In most cases, the touchscreen is generally attached to the front of a display panel, such as a liquid crystal display panel or an organic electroluminescent display panel, using an adhesive.

BRIEF SUMMARY

In some touchscreen manufacturing processes, the touchscreen is separately manufactured and is attached to the front of the display panel, and such processes therefore complicated due to the addition of an attachment step. In addition, a conventional adhesive has a high dielectric constant, whereby the parasitic capacitance between a touch sensor and a light-emitting element is increased and thus touch sensitivity is reduced.

The present disclosure provides a display device that substantially obviates one or more problems due to limitations and disadvantages of the related art.

The present disclosure provides a display device capable of being manufactured through a simplified process and having improved touch sensitivity.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes a light-emitting element disposed on a substrate, an encapsulation unit disposed on the light-emitting element, a touch sensor disposed on the encapsulation unit, and an intermediate layer disposed between the encapsulation unit and the touch sensor and including first and second intermediate layers, wherein the first intermediate layer has a dielectric constant that is lower than a dielectric constant of an organic film disposed above or under the intermediate layer, and the first intermediate layer extends in a non-active area more than the encapsulation unit, whereby touch sensitivity is improved while processing is simplified.

For example, the second intermediate layer has greater hardness than the first intermediate layer, whereby touch sensitivity is further improved.

For example, the first intermediate layer includes an organic materials.

For example, the first and second intermediate layers are disposed along an upper surface of the encapsulation unit and a side surface of the encapsulation unit.

For example, the second intermediate layer is disposed or stacked on the first intermediate layer.

For example, the dielectric constant of the first intermediate layer is between 2.5 and 3.5.

For example, the first intermediate layer comprises a siloxane-based polymer binder having a Si—O bond and mesoporous particles.

For example, each of the mesoporous particles is configured to have a structure in which a plurality of regular hexagonal structures, in each of which a pore is formed, are repeatedly arranged.

For example, each of the mesoporous particles includes a plurality of hexagonal hollow structure.

For example, the siloxane-based polymer binder has a cyclic bond structure.

For example, the second intermediate layer includes a siloxane-based material and silica.

For example, a hardness of an upper region of the second intermediate layer is greater than a hardness of a lower region of the second intermediate layer.

For example, the lower region of the second intermediate layer is thicker than the upper region of the second intermediate layer.

For example, the display device further comprises: a touch passivation film disposed on the touch sensor; a routing line connected to the touch sensor, the routing line being disposed along a side surface of the encapsulation unit; a touch pad connected to the routing line; and a dam disposed between the touch pad and the light-emitting element, wherein the organic film is one of the touch passivation film, the dam, or an organic encapsulation layer of the encapsulation unit.

For example, the routing line is in contact with the second intermediate layer.

For example, the touch sensor includes a touch-sensing line and a touch-driving line intersecting each other with a touch dielectric film disposed between the touch-sensing line and the touch-driving line, and the touch pad includes: a touch pad lower electrode disposed on the substrate; and a touch pad upper electrode connected to the touch pad lower electrode exposed through a touch pad contact hole formed through the first and second intermediate layers and the touch dielectric film.

For example, the touch pad lower electrode and a drain electrode include the same material.

For example, a crack prevention layer is disposed on the touch pad lower electrode.

For example, the dielectric constant of the first intermediate layer is lower than a dielectric constant of at least one of the touch passivation film, the dam, or the organic encapsulation layer.

For example, both of the touch-sensing line and the touch-driving line are opposite to the light-emitting element with the first intermediate layer disposed therebetween (e.g., between the touch-sensing line and the light-emitting element and between the touch-driving line and the light-emitting element).

For example, the routing line is connected to the touch pad lower electrode exposed through a routing contact hole formed through the first and second intermediate layers and the touch dielectric film.

For example, the display device further comprises a bending area disposed on the non-active area which is disposed around an active area of the substrate, wherein the bending area is an area that is bent in order to locate non-display areas on a rear surface of the active area.

For example, the first and second intermediate layers are not disposed on the bending area.

For example, a crack prevention layer and at least one opening are disposed in the bending area.

For example, a touch pad lower electrode is disposed under the crack prevention layer.

In accordance with the purpose of the disclosure, as embodied and broadly described herein, a method of manufacturing a display device comprising: forming a light-emitting element on a substrate; forming an encapsulation unit on the light-emitting element; forming an intermediate layer on the encapsulation unit; and forming a touch sensor on the intermediate layer, wherein the intermediate layer includes first and second intermediate layers, and wherein the first intermediate layer has a dielectric constant that is lower than a dielectric constant of an organic film disposed above or under the intermediate layer, and the second intermediate layer has greater hardness than a hardness of the first intermediate layer.

For example, the second intermediate layer is disposed or stacked on the first intermediate layer.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings. Wherever possible, the same reference numbers will be used throughout the drawings to refer to the same or like parts.

Figure 1:
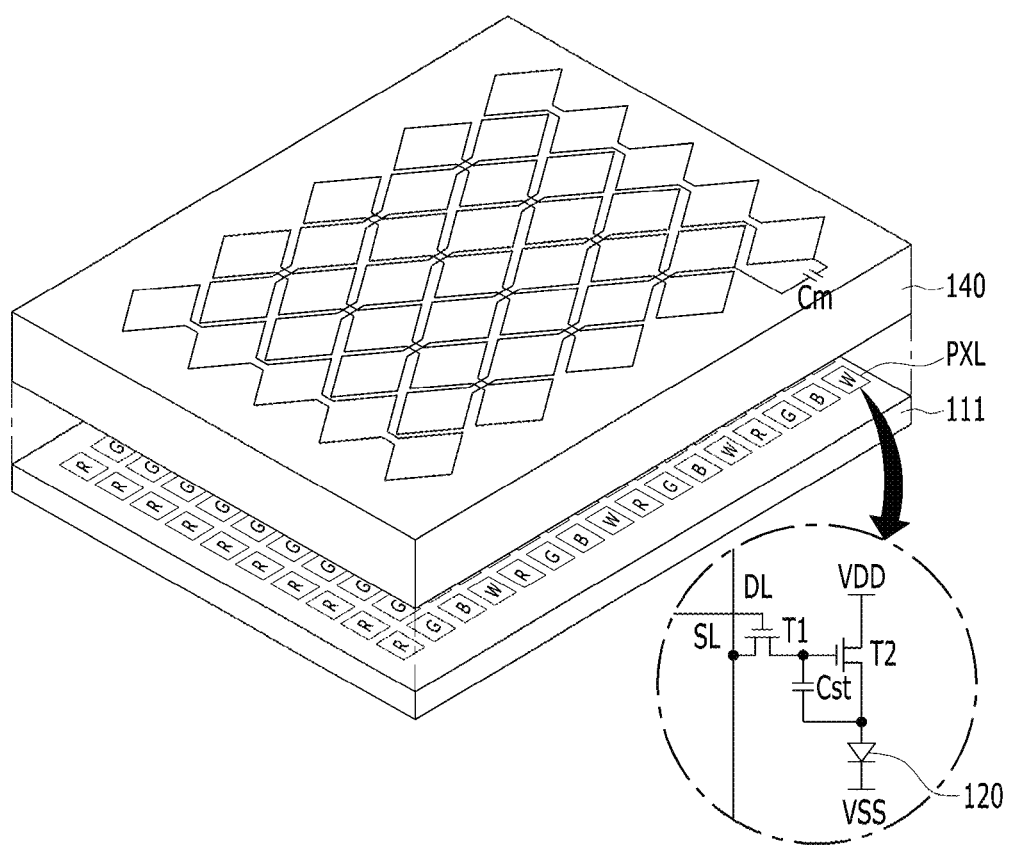
FIG. 1 is a perspective view showing an organic light-emitting display device having a touch sensor according to the present invention.

FIG. 1 is a perspective view showing an organic light-emitting display device having a touch sensor according to the present disclosure.

The organic light-emitting display device having the touch sensor shown in FIG. 1 includes a plurality of subpixels PXL arranged on a substrate 111 in a matrix fashion, an encapsulation unit 140 disposed on the subpixels PXL, and mutual capacitance Cm disposed on the encapsulation unit 140.

The organic light-emitting display device having the touch sensor displays an image through the subpixels PXL, each of which includes a light-emitting element 120, during a display period. In addition, the organic light-emitting display device having the touch sensor detects variation in mutual capacitance Cm (the touch sensor) due to a user's touch during a touch period to sense whether a touch has been performed and the touched position.

Figure 2:
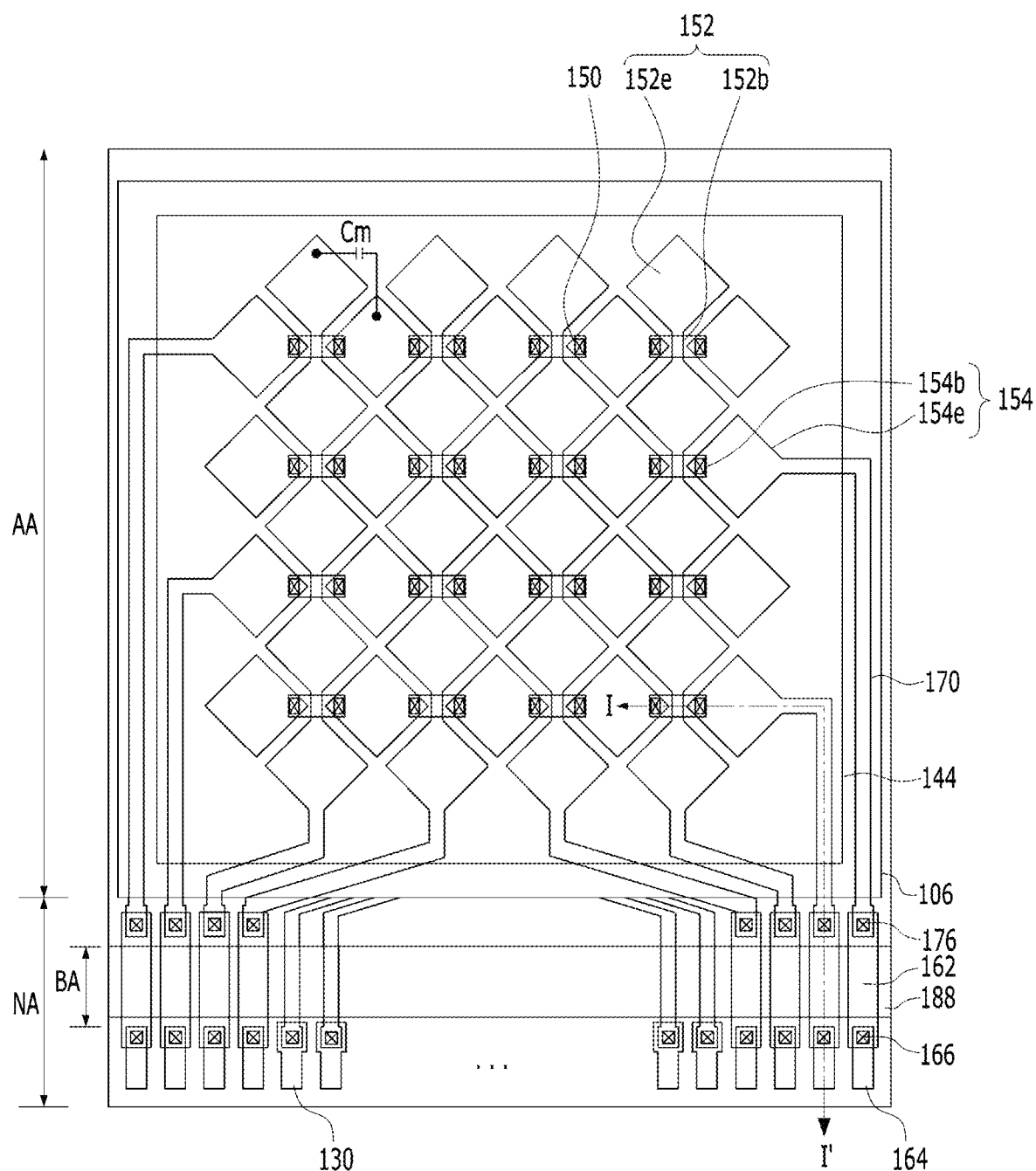
FIG. 2 is a plan view of the organic light-emitting display device having the touch sensor shown in FIG. 1.

As shown in FIG. 2, the organic light-emitting display device having the touch sensor is divided into an active area AA provided on the substrate 111 and a non-active area NA disposed around the active area AA. The substrate 111 is made of a plastic material that exhibits high flexibility, by which the substrate 111 is bendable. For example, the substrate 111 may be made of polyimide (PI), polyethylene terephthalate (PET), polyethylene naphthalate (PEN), polycarbonate (PC), polyether sulfone (PES), polyacrylate (PAR), polysulfone (PSF), or cyclic olefin copolymer (COC).

The active area AA displays an image through unit pixels arranged in a matrix fashion. Each unit pixel includes red (R), green (G), and blue (B) subpixels. Alternatively, each unit pixel may include red (R), green (G), blue (B), and white (W) subpixels.

Each of the subpixels PXL includes a pixel-driving circuit and a light-emitting element 120 connected to the pixel-driving circuit.

As shown in FIG. 1, the pixel-driving circuit includes a switching transistor T1, a driving transistor T2, and a storage capacitor Cst. Meanwhile, in the present disclosure, the pixel-driving circuit has been described as including two transistors T and one capacitor C by way of example. However, the present disclosure is not limited thereto. That is, a 3T1C or 3T2C type pixel-driving circuit having three or more transistors T and one or more capacitors C may be used.

When a scan pulse is supplied to a scan line SL, the switching transistor T1 is turned on to supply a data signal, which is supplied to a data line DL, to the storage capacitor Cst and to a gate electrode of the driving transistor T2.

In response to the data signal supplied to the gate electrode of the driving transistor T2, the driving transistor T2 controls the current that is supplied from a high-voltage (VDD) supply line to the light-emitting element 120 to adjust the amount of light emitted by the light-emitting element 120. Even when the switching transistor T1 is turned off, the driving transistor T2 supplies uniform current to the light-emitting element 120 using the voltage charged in the storage capacitor Cst such that the light-emitting element 120 keeps emitting light until a data signal of the next frame is supplied.

Figure 3:
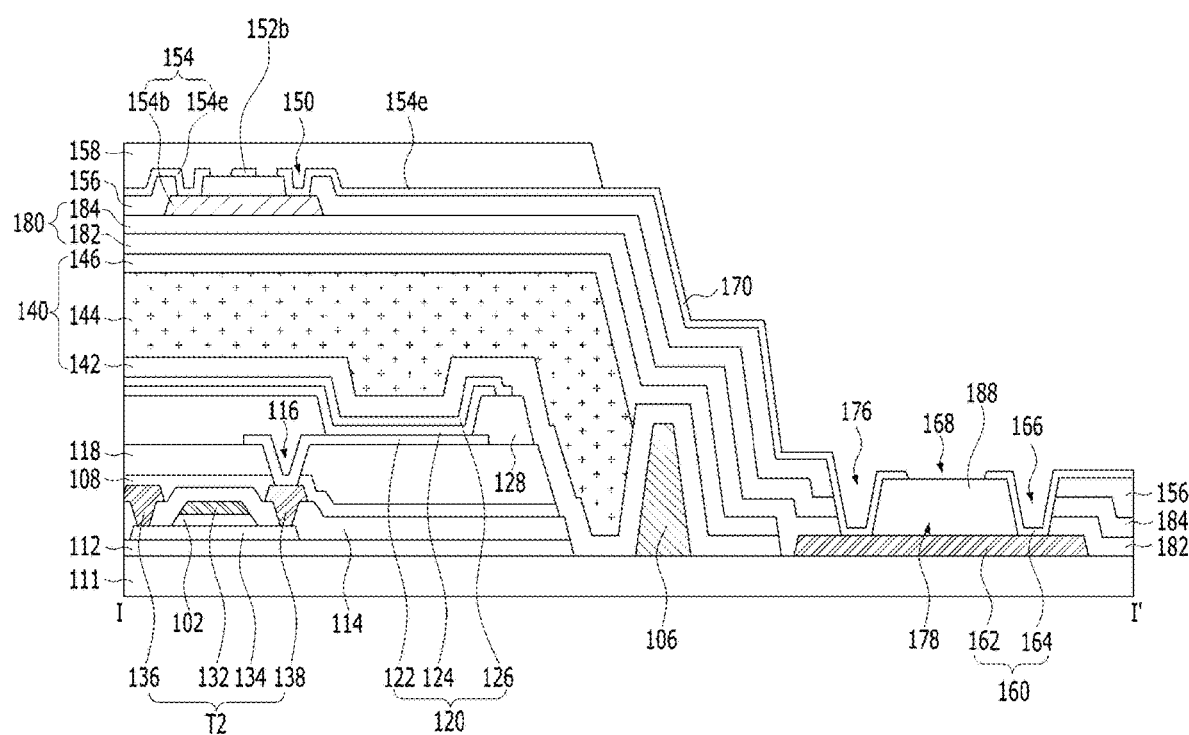
FIG. 3 is a sectional view of the organic light-emitting display device having the touch sensor taken along line I-I' of FIG. 2.

As shown in FIG. 3, the driving transistor T2 includes a semiconductor layer 134 disposed on a buffer layer 112, a gate electrode 132 overlapping the semiconductor layer 134 with a gate dielectric film 102 disposed between the gate electrode 132 and the semiconductor layer 134, and source and drain electrodes 136 and 138 formed on an interlayer dielectric film 114 so as to contact the semiconductor layer 134. Here, the semiconductor layer 134 is made of at least one of an amorphous semiconductor material, a polycrystalline semiconductor material, or an oxide semiconductor material.

The light-emitting element 120 includes an anode electrode 122, at least one light-emitting stack 124 formed on the anode electrode 122, and a cathode electrode 126 formed on the light-emitting stack 124.

The anode electrode 122 is electrically connected to the drain electrode 138 of the driving transistor T2, which is exposed through a pixel contact hole 116 formed through a pixel planarization layer 118. Meanwhile, an inorganic passivation layer may be disposed between the anode electrode 122 and the driving transistor T2, in addition to the pixel planarization layer 118.

The at least one light-emitting stack 124 is formed on the anode electrode 122 in a light-emitting area defined by a bank 128. The at least one light-emitting stack 124 is formed by stacking a hole-related layer, an organic light-emitting layer, and an electron-related layer on the anode electrode 122 in that order or in the reverse order. In addition, the light-emitting stack 124 may include first and second light-emitting stacks that are opposite to each other with a charge generation layer disposed between the first light-emitting stack and the second light-emitting stack. In this case, the organic light-emitting layer of one of the first and second light-emitting stacks generates blue light, and the organic light-emitting layer of the other of the first and second light-emitting stacks generates yellowish-green light. Consequently, white light is generated by the first and second light-emitting stacks. The white light generated by the light-emitting stack 124 is incident on a color filter, which is located above or under the light-emitting stack 124, to realize a color image. Alternatively, each light-emitting stack 124 may generate colored light corresponding to a respective subpixel without a separate color filter in order to realize a color image. That is, the light-emitting stack 124 of the red (R) subpixel may generate red light, the light-emitting stack 124 of the green (G) subpixel may generate green light, and the light-emitting stack 124 of the blue (B) subpixel may generate blue light.

The cathode electrode 126 is formed so as to be opposite the anode electrode 122 with the light-emitting stack 124 disposed between the cathode electrode 126 and the anode electrode 122, and is connected to a low-voltage (VSS) supply line.

The encapsulation unit 140 prevents external moisture or oxygen from permeating into the light-emitting element 120, which has low resistance to external moisture or oxygen.

To this end, the encapsulation unit 140 includes at least one inorganic encapsulation layer 142 and 146 and at least one organic encapsulation layer 144. In the present disclosure, an encapsulation unit 140 having a structure in which a first inorganic encapsulation layer 142, an organic encapsulation layer 144, and a second inorganic encapsulation layer 146 are sequentially stacked will be described by way of example.

The first inorganic encapsulation layer 142 is formed on the substrate 111, on which the cathode electrode 126 is formed. The second inorganic encapsulation layer 146 is formed on the substrate 111, on which the organic encapsulation layer 144 is formed, and is formed so as to surround the upper surface, the lower surface, and the side surface of the organic encapsulation layer 144 together with the first inorganic encapsulation layer 142.

The first and second inorganic encapsulation layers 142 and 146 reduce, minimize or prevent external moisture or oxygen from permeating into the light-emitting stack 124. Each of the first and second inorganic encapsulation layers 142 and 146 is made of an inorganic dielectric material that can be deposited at a low temperature, such as silicon nitride ($SiN_x$), silicon oxide ($SiO_x$), silicon oxide nitride (SiON), or aluminum oxide ($Al_2O_3$). Consequently, each of the first and second inorganic encapsulation layers 142 and 146 is deposited in a low-temperature atmosphere, whereby it is possible to prevent damage to the light-emitting stack 124, which has low resistance to a high-temperature atmosphere, when each of the first and second inorganic encapsulation layers 142 and 146 is deposited.

The organic encapsulation layer 144 reduces stress between the layers due to bending of the organic light-emitting device and improves planarization. The organic encapsulation layer 144 is formed on the substrate 111, on which the first inorganic encapsulation layer 142 is formed, and is made of a non-photosensitive organic dielectric material, such as a particle cover layer (PCL), an acrylic resin, an epoxy resin, polyimide, polyethylene, or silicon oxycarbide (SiOC), or a photosensitive organic dielectric material, such as photo acrylic. The organic encapsulation layer 144 is disposed in the active area AA, excluding the non-active area NA. At this time, a dam 106 is disposed in order to prevent the organic encapsulation layer 144 from spreading to the non-active area NA.

A touch-sensing line 154 and a touch-driving line 152 are disposed in the active area AA of the encapsulation unit 140 so as to intersect each other with a touch dielectric film 156 disposed between the touch-sensing line 154 and the touch-driving line 152. Mutual capacitance Cm is formed at the intersection of the touch-sensing line 154 and the touch-driving line 152. Consequently, the mutual capacitance Cm charges an electric charge by a touch-driving pulse supplied to the touch-driving line 152 and discharges the charged electric charge to the touch-sensing line 154, thereby serving as a touch sensor.

The touch-driving line 152 includes a plurality of first touch electrodes 152e and first bridges 152b for electrically interconnecting the first touch electrodes 152e.

The first touch electrodes 152e are spaced apart from each other on the touch dielectric film 156 by a predetermined distance in a Y direction, which is a first direction. Each of the first touch electrodes 152e is electrically connected to an adjacent first touch electrode 152e via a corresponding one of the first bridges 152b.

The first bridges 152b are disposed on the touch dielectric film 156, which is disposed in the same plane as the first touch electrodes 152e, so as to be electrically connected to the first touch electrodes 152e without separate contact holes. The first bridges 152b are disposed so as to overlap the bank 128, whereby it is possible to prevent the reduction of an aperture ratio due to the first bridges 152b.

The touch-sensing line 154 includes a plurality of second touch electrodes 154e and second bridges 154b for electrically interconnecting the second touch electrodes 154e.

The second touch electrodes 154e are spaced apart from each other on the touch dielectric film 156 by a predetermined distance in an X direction, which is a second direction. Each of the second touch electrodes 154e is electrically connected to an adjacent second touch electrode 154e via a corresponding one of the second bridges 154b.

The second bridges 154b are formed on the second inorganic encapsulation layer 146, and are electrically connected to the second touch electrodes 154e via touch contact holes 150, which are formed through the touch dielectric film 156. In the same manner as the first bridges 152b, the second bridges 154b are disposed so as to overlap the bank 128, whereby it is possible to prevent the reduction of an aperture ratio due to the second bridges 154b.

Meanwhile, the structure in which the second bridges 154b are disposed on the second inorganic encapsulation layer 146, which is disposed at the uppermost part of the encapsulation unit 140, so as to contact the second inorganic encapsulation layer 146 has been described by way of example with reference to FIG. 3. Alternatively, at least one of the first and second touch electrodes 152e and 154e or the first bridges 152b may be disposed on the second inorganic encapsulation layer 146 so as to contact the second inorganic encapsulation layer 146, and the second bridges 154b may be disposed on the touch dielectric film 156.

In the non-active area NA are disposed a display pad 130, which is connected to at least one of the data line DL, the scan line SL, the low-voltage (VSS) supply line, or the high-voltage (VDD) supply line, and a touch pad 160, which is connected to a routing line 170. The display pad 130 and the touch pad 160 may be disposed in the portion of the non-active area NA corresponding to at least one of a one-side portion or an other-side portion of the substrate 111, or may be disposed in different portions of the non-active area NA. Meanwhile, the disposition of the touch pad 160 and the display pad 130 is not limited to the structure shown in FIG. 2. The disposition of the touch pad 160 and the display pad 130 may be variously changed depending on the design of the display device.

Each of the touch pad 160 and the display pad 130 is disposed on the substrate 111, which is exposed by the encapsulation unit 140. That is, each of the touch pad 160 and the display pad 130 is disposed on at least one of the substrate 111, the buffer layer 112, the interlayer dielectric film 114, the passivation layer 108, or the pixel planarization layer 118, which are disposed under the encapsulation unit 140.

The touch pad 160 includes a touch pad lower electrode 162 and a touch pad upper electrode 164, which contacts the touch pad lower electrode 162.

The touch pad lower electrode 162 is made of the same material as at least one of the gate electrode 132 or the drain electrode 138, and is formed on the substrate 111. For example, the touch pad lower electrode 162 is made of the same material as the drain electrode 138, and is disposed on the substrate 111 in the same plane as the drain electrode 138. The touch pad lower electrode 162 is exposed through a routing contact hole 176 formed through first and second intermediate layers 182 and 184 and the touch dielectric film 156, so as to be electrically connected to the routing line 170.

The touch pad upper electrode 164 is connected to the routing line 170 via the touch pad lower electrode 162. The touch pad upper electrode 164 is electrically connected to the touch pad lower electrode 162, which is exposed through a touch pad contact hole 166 formed through the first and second intermediate layers 182 and 184 and the touch dielectric film 156. The touch pad upper electrode 164 is made of the same material as the first and second touch electrodes 152e and 154e, and is formed in the same plane as the first and second touch electrodes 152e and 154e.

The non-active area NA, in which the touch pad 160 and the display pad 130 are disposed, includes a bending area BA that enables the substrate 111 to be bent or folded. The bending area BA is an area that is bent in order to locate non-display areas, such as the touch pad 160 and the display pad 130, on the rear surface of the active area AA. As shown in FIG. 2, the bending area BA is disposed in the upper part of the non-active area NA, which is located between the touch pad 160 and the display pad 130 and the active area AA. Alternatively, the bending area BA may be disposed in at least one of the upper, lower, left, or right part of the non-active area NA. Consequently, the area ratio of the active area AA to the entire screen of the display device is maximized or increased, and the area ratio of the non-active area NA to the entire screen of the display device is minimized or reduced.

As shown in FIG. 2, the routing line 170 is disposed in the bending area BA so as to cross the bending area BA. As shown in FIG. 3, a crack prevention layer 188 and at least one opening 168 and 178 are disposed in the bending area BA such that the bending area BA is easily bent.

The crack prevention layer 188 is made of an organic dielectric material, which has greater strain and impact resistance than an inorganic dielectric film. For example, since the crack prevention layer 188 is formed simultaneously when at least one of the pixel planarization layer 118 or the bank 128 is formed, the crack prevention layer 188 is made of the same material as at least one of the pixel planarization layer 118 or the bank 128 and is disposed in the same plane as at least one of the planarization layer 118 or the bank 128. The crack prevention layer 188, which is made of an organic dielectric material, has greater strain than an inorganic dielectric material, whereby the crack prevention layer 188 reduces bending stress generated when the substrate 111 is bent. Consequently, it is possible for the crack prevention layer 188 to prevent cracks from being formed in the bending area BA and thus to prevent cracks from spreading to the active area AA.

The openings 168 and 178 are formed by removing inorganic dielectric films, which have greater hardness than an organic dielectric material and in which cracks are therefore easily formed due to bending stress applied thereto.

The first opening 168 is formed by removing an inorganic film including at least one of a conductive film or an inorganic dielectric film disposed on the crack prevention layer 188, which overlaps the touch pad lower electrode 162. The routing line 170 and the touch pad upper electrode 164 are spaced apart from each other with the first opening 168 disposed between the routing line 170 and the touch pad upper electrode 164.

The second opening 178 is formed by removing the buffer layer 112, the gate dielectric film 102, the interlayer dielectric film 114, and the passivation layer 108 disposed in the non-active area NA, which overlaps the crack prevention layer 188. The second opening 178 is formed using the same mask process as at least one of the source and drain contact holes, which expose the semiconductor layer 134, or the pixel contact hole 116, whereby structure and process simplification is achieved.

In the present disclosure, as described above, it is possible to prevent the generation of cracks due to the openings 168 and 178 and the crack prevention layer 188 disposed in the bending area BA. Consequently, it is possible to prevent cracks from spreading to the active area AA, thereby preventing line defects and abnormal driving of elements.

Meanwhile, an intermediate layer 180 is provided between the touch sensor and the encapsulation unit 140.

The intermediate layer 180 includes the first and second intermediate layers 182 and 184, which are sequentially stacked between the touch sensor and the encapsulation unit 140. Specifically, the second intermediate layer 184 is stacked on the first intermediate layer 182.

The first intermediate layer 182 is disposed on the second inorganic encapsulation layer 146, which is disposed at the uppermost part of the encapsulation unit 140. The first intermediate layer 182 is formed by dispersing mesoporous particles in a binder resin.

Figure 4A:
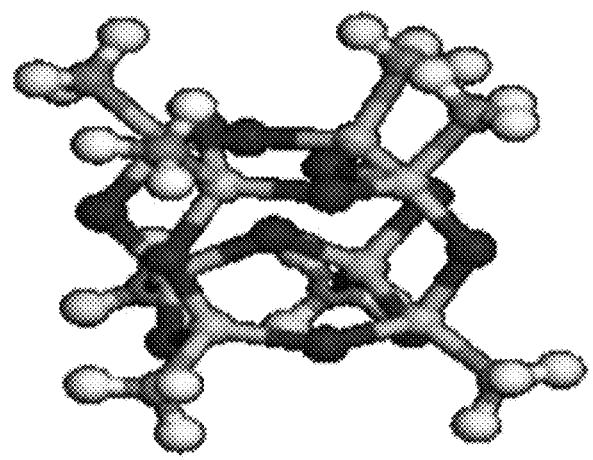
FIG. 4A is a view showing a siloxane-based polymer binder of the first intermediate layer shown in FIG. 3.

As shown in FIG. 4A, a siloxane-based polymer having a Si—O bond is used as a binder resin 182a included in the first intermediate layer 182.

Figure 4B:
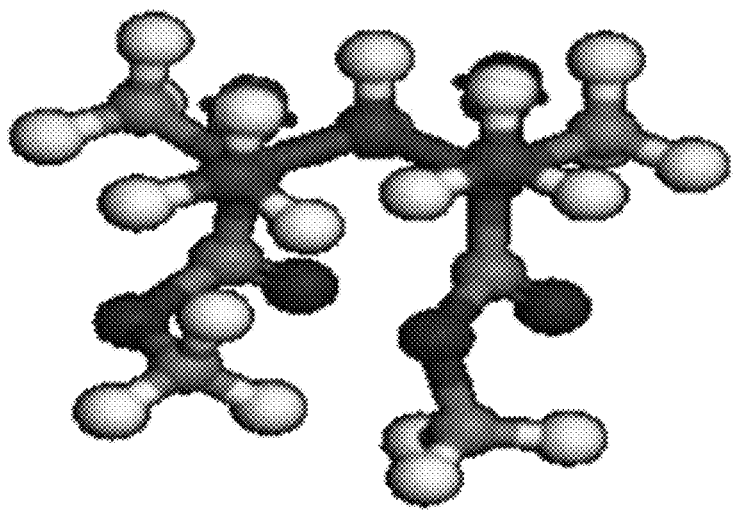
FIG. 4B is a view showing an acrylic-based polymer binder of a comparative example.

The Si—O bond of the siloxane-based polymer according to the present disclosure has greater bonding energy than a C—C bond of an acrylic-based polymer as shown in FIG. 4B, the Si—O bond length of the siloxane-based polymer is longer than the C—C bond length of the acrylic-based polymer, and the Si—O—Si bond angle of the siloxane-based polymer is longer than the C—H bond angle or the C—C—H bond angle of the acrylic-based polymer. Consequently, the siloxane-based polymer used for the binder resin 182a of the first intermediate layer 182 is bulky, and therefore volumetric density is reduced, whereby it is possible to secure a low dielectric constant.

Figure 5:
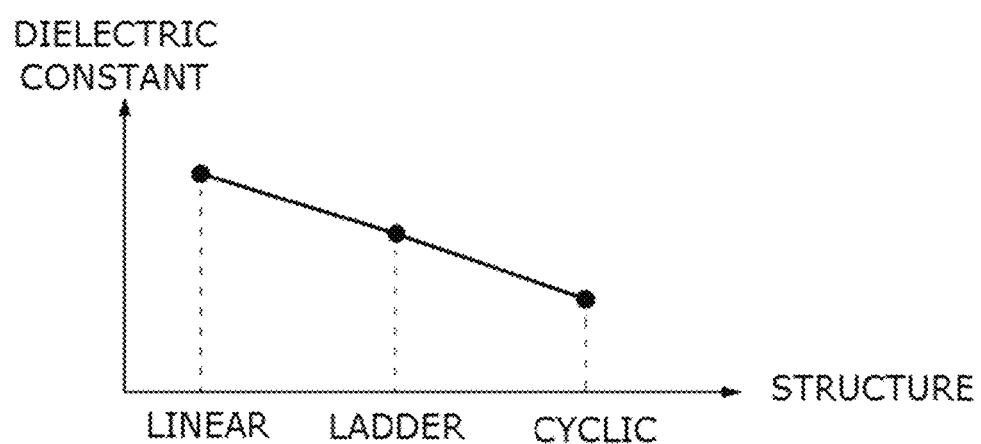
FIG. 5 is a graph illustrating the dielectric constant of the siloxane-based polymer binder of the first intermediate layer shown in FIG. 3 depending on the structure thereof.
Figure 5:
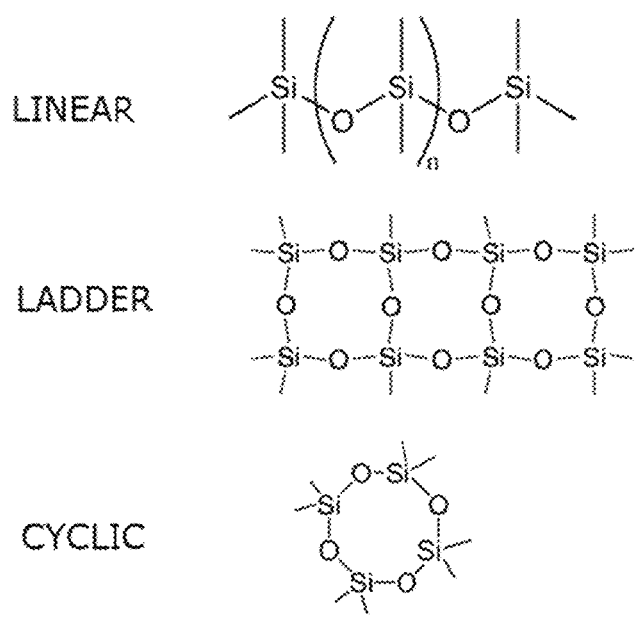

In addition, as shown in FIG. 5, the Si—O—Si bond of the siloxane-based polymer binder resin 182a has the cyclic bond structure shown in FIG. 5. The cyclic bond structure has a wider space between molecules than a linear bond structure and a ladder-type bond structure, and therefore the cyclic bond structure is bulky, whereby volumetric density is reduced. Consequently, the first intermediate layer 182 including the siloxane-based polymer binder resin 182a having the cyclic bond structure has a lower dielectric constant than when the first intermediate layer includes the siloxane-based polymer binder having the linear bond structure or the ladder-type bond structure.

Figures 6, 7A, 7B:
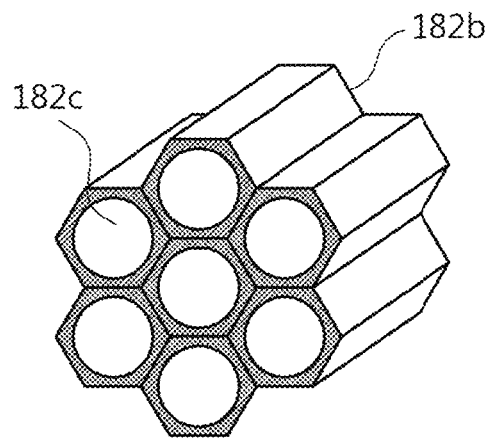
FIG. 6 is a perspective view showing a mesoporous particle of the first intermediate layer shown in FIG. 3.
FIGS. 7A and 7B are views showing embodiments of a second intermediate layer shown in FIG. 3.

As shown in FIG. 6, a mesoporous particle 182b included in the first intermediate layer 182 is configured to have a hexagonal structure (e.g., hexagonal hollow structure) including a pore 182c. A space having a size (e.g., a diameter of the pore 182c) of 1 nm to 10 nm is formed by the pore 182c in the mesoporous particle 182b, whereby the volumetric density thereof is further reduced.

In addition, the mesoporous particle 182b is configured to have a structure in which regular hexagonal structures are repeatedly arranged. On the assumption that the center of the regular hexagon is a symmetrical point or a straight line passing through the center of the regular hexagon is a symmetrical line, the mesoporous particle 182b has a point-symmetrical structure or a line-symmetrical structure. The mesoporous particle 182b may reduce or minimize polarity, and therefore the bond length thereof is increased, whereby the volumetric density thereof is further reduced.

Meanwhile, the first intermediate layer 182 further includes a surfactant and a coupling agent. For thickness stability thereof, a fluoro-based surfactant is used as the surfactant. In order to increase the force of adhesion with the second inorganic encapsulation layer 146 of the encapsulation unit 140 and with the second intermediate layer 184, a silane-based coupling agent is used as the coupling agent.

The first intermediate layer 182 has a lower dielectric constant than at least one of a touch passivation film 158, made of an acrylic material or an epoxy material, the dam 106, or the organic encapsulation layer 144. In some embodiments, the first intermediate layer 182 has a dielectric constant between 2.5 and 3.5, which is lower than the dielectric constant of one of the touch passivation film 158, the dam 106, and the organic encapsulation layer 144, which is about 3.5 to 4.0. In this case, both of the touch-sensing line 154 and the touch-driving line 152 are opposite to the light-emitting element 120 with the first intermediate layer 182 disposed therebetween (e.g., between the touch-sensing line 154 and the light-emitting element 120 and between the touch-driving line 152 and the light-emitting element 120), whereby it is possible to minimize or reduce the parasitic capacitance between each of the touch-sensing line 154 and the touch-driving line 152 and the light-emitting element 120. Consequently, it is possible to prevent mutual effects between each of the touch-sensing line 154 and the touch-driving line 152 and the light-emitting element 120 due to coupling therebetween, whereby it is possible to improve touch sensitivity.

The second intermediate layer 184 is disposed between the first intermediate layer 182 and the touch sensor Cm, and contacts the routing line 170. Since the touch sensor Cm and the routing line 170 are disposed on the second intermediate layer 184, the second intermediate layer 184 is formed so as to have greater hardness than the first intermediate layer 182.

The second intermediate layer 184 is made of a mixture of a siloxane-based material and silica, and is formed by designing a network. The mechanical properties of the second intermediate layer 184, such as the degree of curing, film hardness, and elastic modulus thereof, are improved. The second intermediate layer 184 having improved degree of curing may inhibit the penetration of moisture, thereby improving yield. In addition, the second intermediate layer 184 having an improved elastic modulus may reduce the stress applied to the first intermediate layer 182, thereby preventing the generation and spreading of cracks and thus improving yield. Furthermore, the touch sensor may be easily formed on the second intermediate layer 184 having improved film hardness.

A first embodiment of the second intermediate layer 184 may have high hardness that is uniform throughout the entirety thereof, as shown in FIG. 7A, or a second embodiment of the second intermediate layer 184 may have different values of hardness in the upper and lower regions 184b and 184a thereof, as shown in FIG. 7B.

The second intermediate layer 184 shown in FIG. 7A is formed so as to include an initiator that reacts to a long wavelength, whereby the second intermediate layer 184 may have high hardness throughout the entire region thereof.

The second intermediate layer 184 shown in FIG. 7B includes a lower region 184a and an upper region 184b, which is disposed on the lower region 184a.

The lower region 184a has a greater thickness than the upper region 184b and has lower hardness than the upper region 184b. To this end, the lower region 184a is formed so as to include an initiator that reacts to a short wavelength, to have a lower content of silica than the upper region 184b, or to include silica having lower hardness than the upper region 184b. Since the lower region 184a having low hardness is flexible, the lower region 184a may also be bent when the flexible display device is bent.

The upper region 184b is disposed on the lower region 184a while having greater hardness than the lower region 184a. To this end, the upper region 184b is formed so as to include an initiator that reacts to a long wavelength, to have a greater content of silica than the lower region 184a, or to include silica having greater hardness than the lower region 184a. Since the upper region 184b has high hardness, the touch sensor may be easily formed on the upper region 184b.

The properties of the material for an intermediate layer 180 according to Example, which is disposed between the touch sensor Cm and the encapsulation unit 140, will be described with reference to Table 1.

In Table 1, Comparative Example 1 is a structure in which the touch sensor is attached to an organic light-emitting display panel using an adhesive, and Comparative Example 2 is a structure in which a touch buffer film, made of an inorganic dielectric material, is disposed between the touch sensor and the encapsulation unit.

TABLE 1

| Properties | Comparative Example 1 (adhesive) | Comparative Example 2 (touch buffer film) | Example (intermediate layer) |
|---|---|---|---|
| Dielectric constant (@ 100 kHz) | 3.4 | 6.8 | 2.9 |
| Adhesive force | 5B | 5B | 5B |
| Film retention rate | — | — | 80% or more |
| Transmittance | 94.7% | 96.2% | 95.0% |
| Pencil hardness | 6B | 3H | H |
| Elastic modulus (DMA) | $3.8 \times 10^5$ Pa | $146 \times 10^9$ Pa | $5.0 \times 10^7$ Pa |

As shown in Table 1, it can be seen that the intermediate layer 180 according to Example has a lower dielectric constant than the adhesive according to Comparative Example 1 and the touch buffer film according to Comparative Example 2 and has excellent thin film properties, such as thickness stability (film retention rate), adhesive force, transmittance, and film hardness.

In particular, since the intermediate layer 180 according to Example has a lower dielectric constant than the adhesive according to Comparative Example 1 and the touch buffer film according to Comparative Example 2, it is possible to improve touch sensitivity according to the present disclosure.

In addition, the intermediate layer 180 according to Example has a pencil hardness of about H, whereas the adhesive according to Comparative Example 1 has a pencil hardness of about 6 B and the touch buffer film according to Comparative Example 2 has a pencil hardness of about 3 H. Since the adhesive according to Comparative Example 1 has low hardness and low elastic modulus, the touch sensor cannot be directly formed on the adhesive, whereby the process of Comparative Example 1 is complicated. In addition, since the touch buffer film according to Comparative Example 2 has ultrahigh hardness and an ultrahigh elastic modulus, cracks may be easily formed in the touch buffer film according to Comparative Example 2 due to external impact. In contrast, since the intermediate layer 180 according to Example has high hardness and a high elastic modulus, it is possible to prevent the generation and spreading of cracks, and it is possible to easily form the touch sensor on the intermediate layer 180.

FIGS. 8A to 8E are sectional views showing a method of manufacturing the organic light-emitting display device having the touch sensor shown in FIG. 3.

Figure 8A:
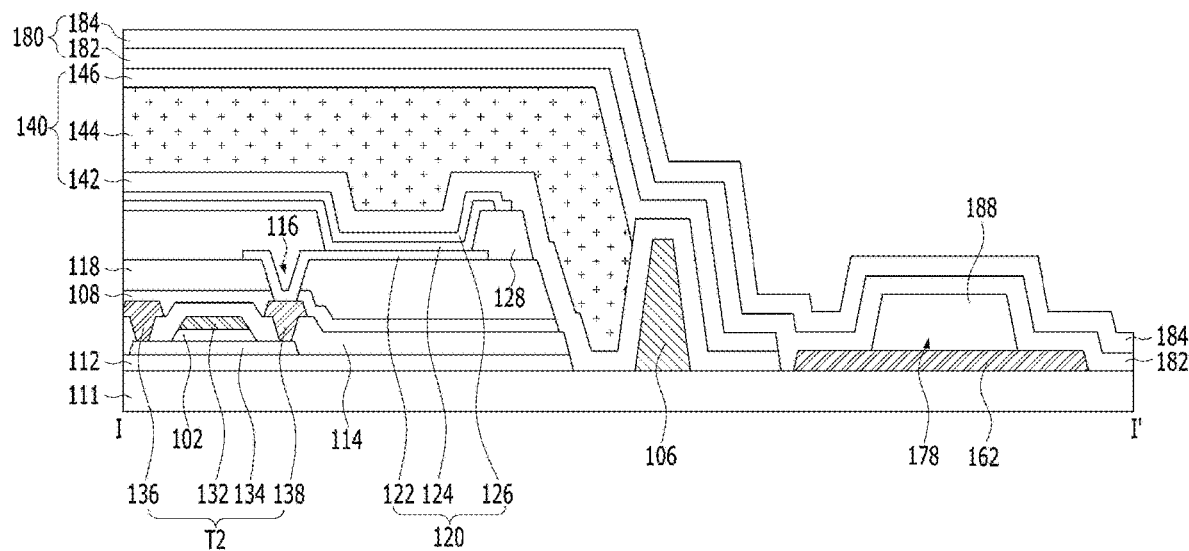
FIGS. 8A to 8E are sectional views showing a method of manufacturing the organic light-emitting display device having the touch sensor shown in FIG. 3.

Referring to FIG. 8A, a switching transistor T1, a driving transistor T2, a touch pad lower electrode 162, a light-emitting element 120, an encapsulation unit 140, and an intermediate layer 180 are formed on a substrate 111.

Specifically, a switching transistor T1, a driving transistor T2, a touch pad lower electrode 162, and an organic light-emitting element 120 are formed on a substrate 111 through a plurality of mask processes. Subsequently, an inorganic encapsulation layer 142 is formed on the substrate 111, on which the organic light-emitting element 120 is formed, using a deposition method, such as chemical vapor deposition (CVD), low-pressure chemical vapor deposition (LPCVD), or plasma-enhanced chemical vapor deposition (PECVD). Here, the inorganic encapsulation layer 142 is made of $SiO_x$, $SiN_x$, or SiON. Subsequently, a photosensitive or non-photosensitive first organic dielectric material is coated on the substrate 111, on which the inorganic encapsulation layer 142 is formed, to form an organic encapsulation layer 144. Here, an organic dielectric material, such as a particle cover layer (PCL), an acrylic resin, an epoxy resin, polyimide, polyethylene, or silicon oxycarbide (SiOC), is used as the organic encapsulation layer 144. Subsequently, an inorganic dielectric material is deposited on the substrate 111, on which the organic encapsulation layer 144 is formed, so as to form a second inorganic encapsulation layer 146. A first intermediate layer 182, including a siloxane-based polymer binder having an Si—O bond and mesoporous particles, is formed on the entire surface of the second inorganic encapsulation layer 146, and a second intermediate layer 184, in which a siloxane-based material and silica are mixed with each other, is formed on the entire surface of the first intermediate layer 182.

At this time, the intermediate layer 180 is disposed so as to cover the touch pad lower electrode 162, which is exposed by a crack prevention layer 188, in order to protect the touch pad lower electrode 162.

Figure 8B:
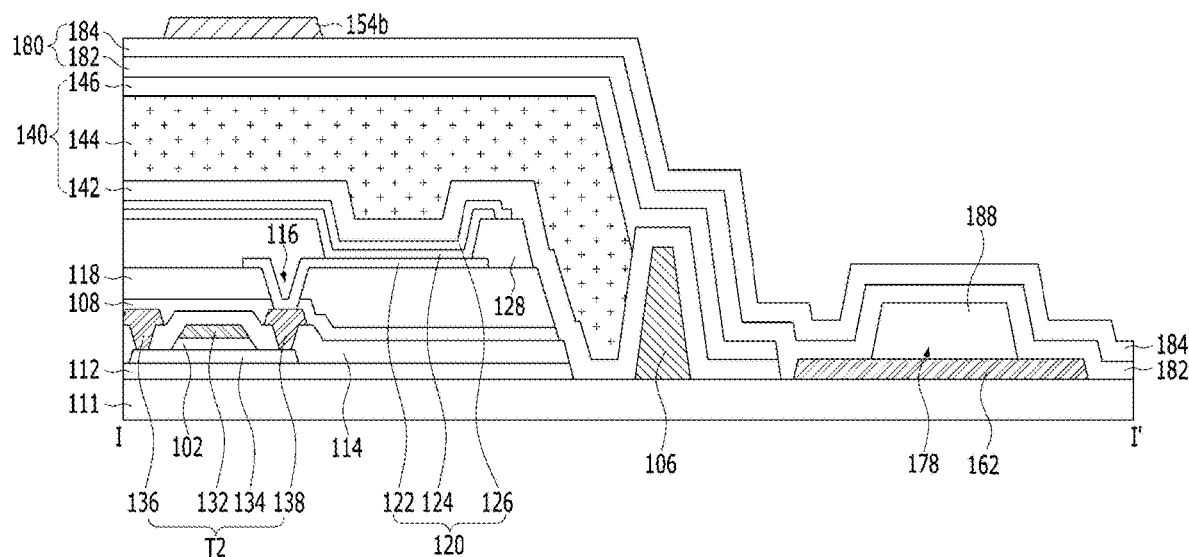

Referring to FIG. 8B, a second bridge 154b is formed on the substrate 111, on which the intermediate layer 180 is formed.

Specifically, an opaque conductive layer is formed on the entire surface of the substrate 111, on which the intermediate layer 180 is formed, at normal temperature through a deposition process using sputtering. Subsequently, the opaque conductive layer is patterned through a photolithography and etching process to form a second bridge 154b. Here, the opaque conductive layer is made of a metal, such as Al, Ti, Cu, Mo, Ta, or MoTi, and is formed so as to have a single-layered or multi-layered structure. At this time, the touch pad lower electrode 162, which is made of the same material as the second bridge 154b, is protected by the intermediate layer 180, whereby it is possible to prevent damage to the touch pad lower electrode 162 when the second bridge 154*b* is formed by etching.

Figure 8C:
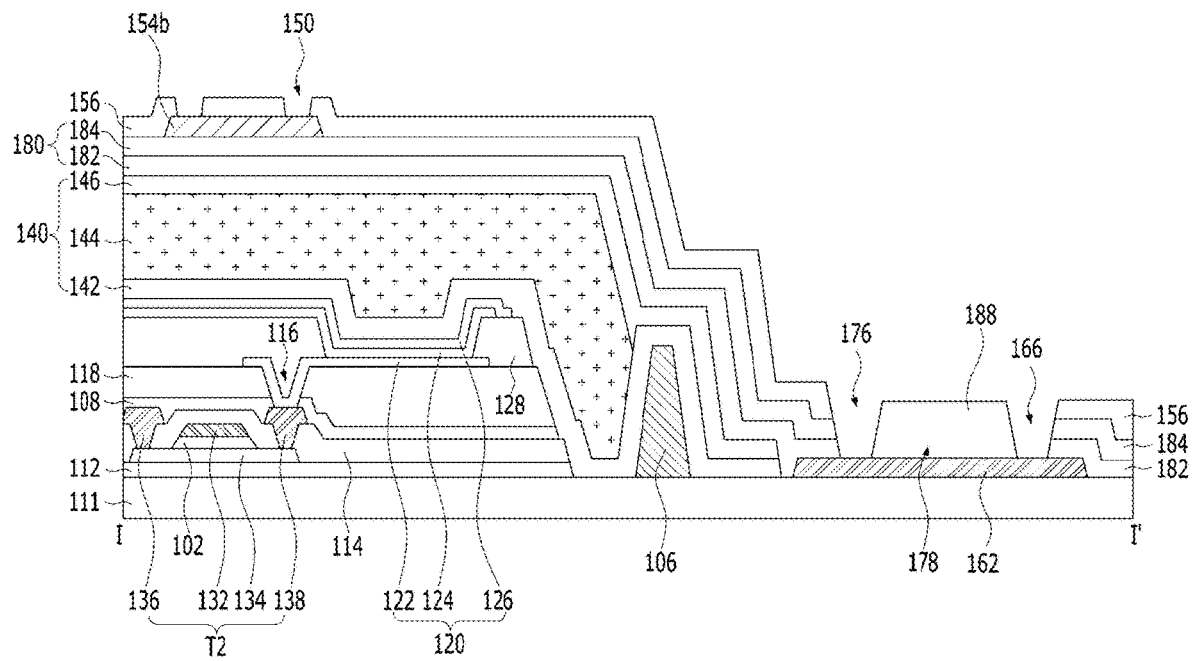

Referring to FIG. 8C, a touch dielectric film 156 is formed on the substrate 111, on which the second bridge 154*b* is formed.

Specifically, an inorganic dielectric material is stacked on the substrate 111, on which the second bridge 154*b* is formed, to form a touch dielectric film 156. Subsequently, the first and second intermediate layers 182 and 184 and the touch dielectric film 156 in a non-active area NA are patterned through a photolithography and etching process to form a routing contact hole 176 and a touch pad contact hole 166. At the same time, the touch dielectric film 156 in an active area AA is patterned to form a touch contact hole 150.

Figure 8D:
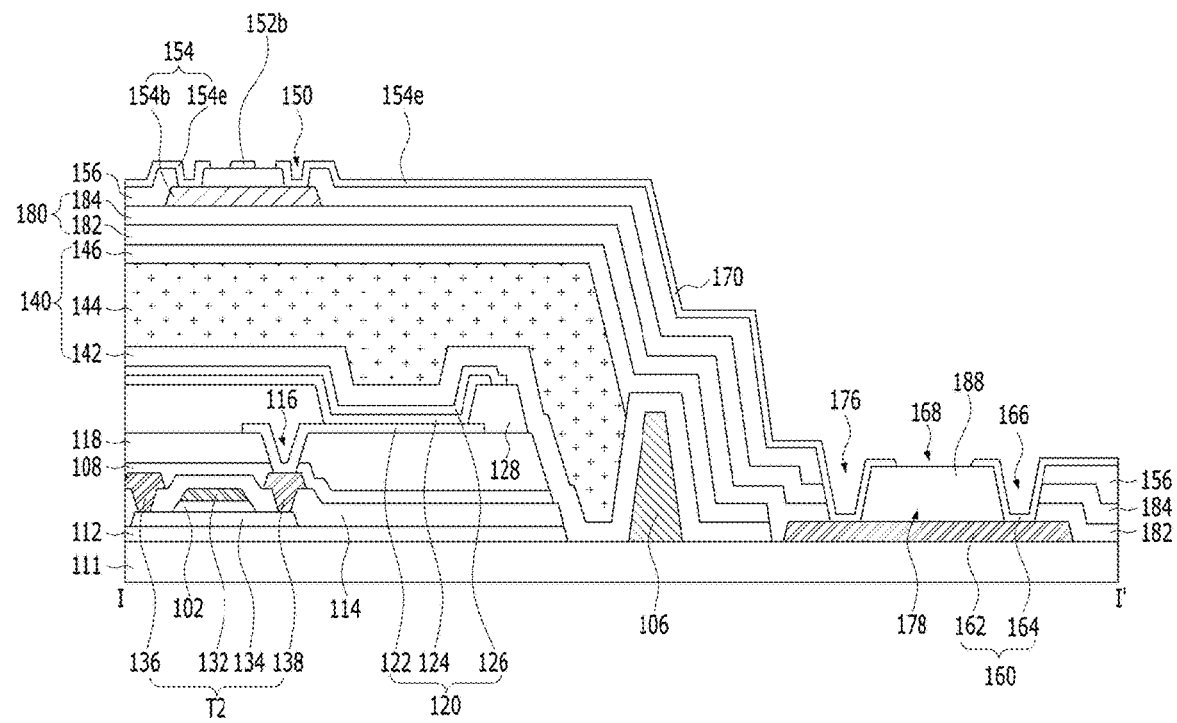

Referring to FIG. 8D, first and second touch electrodes 152*e* and 154*e*, a first bridge 152*b*, a routing line 170, and a touch pad upper electrode 164 are formed on the substrate 111, in which the routing contact hole 176, the touch pad contact hole 166, and the touch contact hole 150 are formed.

Specifically, a transparent conductive layer, such as one made of ITO, IZO, or IGZO, is deposited on the entire surface of the substrate 111, in which the routing contact hole 176, the touch pad contact hole 166, and the touch contact hole 150 are formed, and the transparent conductive layer is patterned through a photolithography and etching process. As a result, first and second touch electrodes 152*e* and 154*e*, a first bridge 152*b*, a routing line 170, and a touch pad upper electrode 164 are formed. At this time, the touch pad upper electrode 164, which is disposed on the crack prevention layer 188, is spaced apart from another touch pad upper electrode 164 with a second opening 178 disposed therebetween.

Figure 8E:
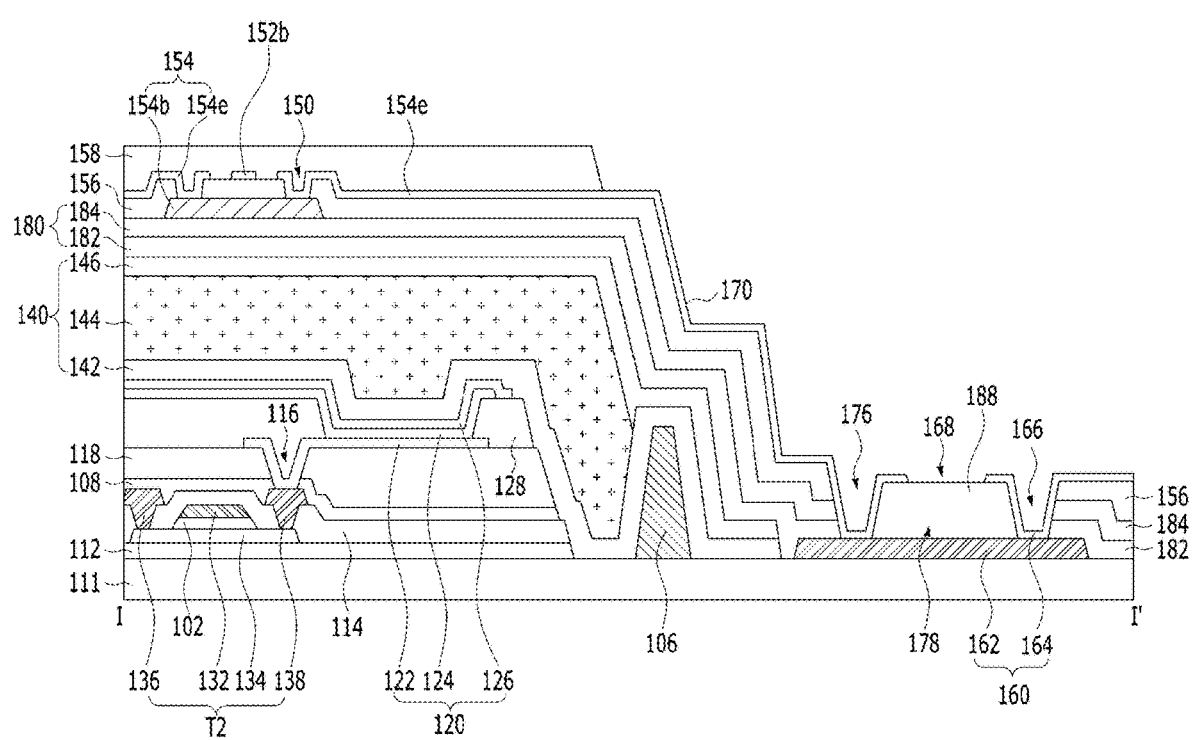

Referring to FIG. 8E, a touch passivation film 158 is formed on the substrate 111, on which the first and second touch electrodes 152*e* and 154*e*, the first bridge 152*b*, the routing line 170, and the touch pad upper electrode 164 are formed.

Specifically, an organic dielectric material is formed on the entire surface of the substrate 111, on which the first and second touch electrodes 152*e* and 154*e*, the first bridge 152*b*, the routing line 170, and the touch pad upper electrode 164 are formed. Subsequently, the organic dielectric material is patterned through a photolithography and etching process to form a touch passivation film 158. The touch passivation film 158 is made of an organic dielectric material, such as epoxy or acrylic, and is formed in the form of a thin film, a general film, or a polarizing film.

Meanwhile, in the present disclosure, the display device having the bending area BA has been described by way of example. Alternatively, the present disclosure is also applicable to a display device having no bending area BA.

Also, in the present disclosure, at least one of color filter or a black matrix disposed above or under the first and second touch electrodes 152*e* and 154*e* may be further provided.

Furthermore, in the present disclosure, the first and second touch electrodes 152*e* and 154*e* and the first and second bridges 152*b* and 154*b* have been described by way of example as being formed in a plate shape, as shown in FIG. 3. Alternatively, at least one of the first and second touch electrodes 152*e* and 154*e* or the first and second bridges 152*b* and 154*b* may be formed in a mesh shape. At this time, at least one of the first and second touch electrodes 152*e* and 154*e* or the first and second bridges 152*b* and 154*b* has a structure having at least one layer made of at least one of Ti, Al, Mo, MoTi, Cu, Ta, or ITO, and is formed in a mesh shape. For example, at least one of the first and second touch electrodes 152*e* and 154*e* or the first and second bridges 152*b* and 154*b* is formed to have a three-layer stack structure, such as Ti/Al/Ti, MoTi/Cu/MoTi, or Ti/Al/Mo. The routing line 170, which is made of the same material as at least one of the first and second touch electrodes 152*e* and 154*e* or the first and second bridges 152*b* and 154*b*, is also formed to have a three-layer stack structure, such as Ti/Al/Ti, MoTi/Cu/MoTi, or Ti/Al/Mo.

Consequently, the resistance and capacitance of each of the first and second touch electrodes 152*e* and 154*e* and the first and second bridges 152*b* and 154*b* are reduced, whereby an RC time constant is reduced and thus touch sensitivity is improved. In addition, the line width of each of the first and second touch electrodes 152*e* and 154*e* and the first and second bridges 152*b* and 154*b* is very small, whereby it is possible to prevent the reduction of an aperture ratio and transmittance.

As is apparent from the above description, the organic light-emitting display device according to the present disclosure is configured such that touch electrodes are disposed on an encapsulation unit, unlike a conventional organic light-emitting display device, to which a touchscreen is attached using an adhesive. As a result, no separate adhesion process is required, whereby processing is simplified and costs are reduced. In addition, the organic light-emitting display device according to the present disclosure is configured such that an intermediate layer including a first intermediate layer, which has a low dielectric constant, and a second intermediate layer, which has high hardness, is disposed between a touch sensor and the encapsulation unit, whereby touch sensitivity is improved and moisture permeation is prevented.

It will be apparent to those skilled in the art that various modifications and variations can be made in the present disclosure without departing from the spirit or scope of the disclosure.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a light-emitting element disposed on a substrate;
an encapsulation unit disposed on the light-emitting element;
a touch sensor disposed on the encapsulation unit; and
an intermediate layer disposed between the encapsulation unit and the touch sensor, the intermediate layer including first and second intermediate layers, wherein
the first intermediate layer has a dielectric constant that is lower than a dielectric constant of an organic film disposed above or under the intermediate layer,
the first intermediate layer extends in a non-active area more than the encapsulation unit.

2. The display device according to claim 1, wherein the second intermediate layer has greater hardness than the first intermediate layer.

3. The display device according to claim 1, wherein the first intermediate layer includes an organic material.

4. The display device according to claim 1, wherein the first and second intermediate layers are disposed along an upper surface of the encapsulation unit and a side surface of the encapsulation unit.

5. The display device according to claim 1, wherein the second intermediate layer is disposed on the first intermediate layer.

6. The display device according to claim 1, wherein the dielectric constant of the first intermediate layer is between 2.5 and 3.5.

7. The display device according to claim 1, wherein the second intermediate layer includes a siloxane-based material and silica.

8. The display device according to claim 1, wherein a hardness of an upper region of the second intermediate layer is greater than a hardness of a lower region of the second intermediate layer.

9. The display device according to claim 8, wherein the lower region of the second intermediate layer is thicker than the upper region of the second intermediate layer.

10. The display device according to claim 1, wherein the first intermediate layer comprises a siloxane-based polymer binder having a Si—O bond and mesoporous particles.

11. The display device according to claim 10, wherein each of the mesoporous particles includes a plurality of hexagonal hollow structures.

12. The display device according to claim 10, wherein the siloxane-based polymer binder has a cyclic bond structure.

13. The display device according to claim 1, further comprising a bending area disposed on the non-active area which is disposed around an active area of the substrate, wherein the bending area is an area that is bent in order to locate non-display areas on a rear surface of the active area.

14. The display device according to claim 13, wherein the first and second intermediate layers are not disposed on the bending area.

15. The display device according to claim 13, further comprising a crack prevention layer and at least one opening disposed in the bending area.

16. The display device according to claim 15, further comprising a touch pad lower electrode disposed under the crack prevention layer.

17. The display device according to claim 1, further comprising:
a touch passivation film disposed on the touch sensor;
a routing line connected to the touch sensor, the routing line being disposed along a side surface of the encapsulation unit;
a touch pad connected to the routing line; and
a dam disposed between the touch pad and the light-emitting element, wherein
the organic film is one of the touch passivation film, the dam, or an organic encapsulation layer of the encapsulation unit.

18. The display device according to claim 17, wherein the routing line is in contact with the second intermediate layer.

19. The display device according to claim 17, wherein
the touch sensor includes a touch-sensing line and a touch-driving line intersecting each other,
wherein a touch dielectric film is disposed between the touch-sensing line and the touch-driving line, and
the touch pad includes:
a touch pad lower electrode disposed on the substrate; and
a touch pad upper electrode connected to the touch pad lower electrode exposed through a touch pad contact hole formed through the first and second intermediate layers and the touch dielectric film.

20. The display device according to claim 19, further comprising a crack prevention layer disposed on the touch pad lower electrode.

21. The display device according to claim 19, wherein the touch pad lower electrode and a drain electrode include the same material.

22. The display device according to claim 19, wherein the routing line is connected to the touch pad lower electrode exposed through a routing contact hole formed through the first and second intermediate layers and the touch dielectric film.

23. The display device according to claim 19, wherein the dielectric constant of the first intermediate layer is lower than a dielectric constant of at least one of the touch passivation film, the dam, or the organic encapsulation layer.

24. The display device according to claim 23, wherein both of the touch-sensing line and the touch-driving line are opposite to the light-emitting element with the first intermediate layer disposed therebetween.

25. A method of manufacturing a display device, comprising:
forming a light-emitting element on a substrate;
forming an encapsulation unit on the light-emitting element;
forming an intermediate layer on the encapsulation unit; and
forming a touch sensor on the intermediate layer,
wherein the intermediate layer includes first and second intermediate layers, and
wherein the first intermediate layer has a dielectric constant that is lower than a dielectric constant of an organic film disposed above or under the intermediate layer, and the second intermediate layer has greater hardness than a hardness of the first intermediate layer.

26. The method according to claim 25, wherein the second intermediate layer is disposed on the first intermediate layer.

* * * * *